United States Patent [19]
Kim

[11] Patent Number: 6,107,646
[45] Date of Patent: Aug. 22, 2000

[54] VARIABLE LIGHT SOURCE AND OPTICAL PICKUP APPARATUS FOR DIFFERENT-TYPE OPTICAL DISC USING THE SAME

[75] Inventor: Young Sik Kim, Seoul, Rep. of Korea

[73] Assignee: LG Electronics, Inc., Seoul, Rep. of Korea

[21] Appl. No.: 09/001,013

[22] Filed: Dec. 30, 1997

[30] Foreign Application Priority Data

Dec. 31, 1996 [KR] Rep. of Korea ...................... 96-79679

[51] Int. Cl.[7] .......................... H01L 29/41; H01L 33/00; H01S 3/19
[52] U.S. Cl. ................. 257/91; 257/13; 257/98; 257/99; 257/91; 372/46; 372/50
[58] Field of Search ................. 257/91, 95, 99, 257/98, 13, 81; 372/46, 50

[56] References Cited

U.S. PATENT DOCUMENTS

| | | | |
|---|---|---|---|
| 5,274,246 | 12/1993 | Hopkins et al. | 257/17 |
| 5,585,957 | 12/1996 | Nakao et al. | 257/13 |
| 5,625,201 | 4/1997 | Holm et al. | 257/88 |

FOREIGN PATENT DOCUMENTS 364059969  3/1989  Japan ...................................... 257/98

*Primary Examiner*—Jerome Jackson, Jr.

[57] ABSTRACT

A variable light capable of varying the size of light beam and an optical pickup apparatus for a different-type optical disc employing the same. The variable light source is provided with a double hetero structure formed to incorporate a multiple quantum well active layer on a semiconductor layer, a current confined structure for progressing carriers drifting toward the multiple quantum well active layer in a combined direction of a perpendicular direction with a progressing direction of a light beam, and an electrode pattern provided on the upper part of the current confined structure for varying a drift speed of carriers drifting in the progressing direction of light beam by a variable current signal. The variable light source can vary the size of light beam by controlling an amount of the variable current signal. Also, the variable light source generates an appropriate size of light beam in accordance the type of optical disc by the variable current signal, thereby simplifying the configuration of the different-type optical disc pickup apparatus.

6 Claims, 5 Drawing Sheets

LIGHT BEAM

LIGHT BEAM

LIGHT BEAM

VARIABLE LIGHT SOURCE AND OPTICAL PICKUP APPARATUS FOR DIFFERENT-TYPE OPTICAL DISC USING THE SAME

BACKGROUND OF THE INVENTION

1. Field of the Invention

This invention relates to a light source used for an optical pickup apparatus capable of optically accessing an optical disc, and more particularly to a variable light source capable of varying the size of light beam. Also, this invention is directed to an optical pickup apparatus for a different-type optical disc which can simplify its configuration by employing the variable light source.

2. Description of the Prior Art

The recent recording medium requires a capability of recording a higher capacity of information in accordance with change into a large-scale of information quantity. Accordingly, an optical disc showing a remarkable increase of an occupation rate in the recording medium market also has been developed such that it is possible to record a high capacity of information. As a result, in the optical disc market, there has appeared a digital versatile or video disc (DVD), a recording capacity of which is much greater than that of the existing compact disc(CD) and the rewritable compact disc (CD-R). This DVD is not only higher than the CD and CD-R in a recording density, that is, in a track density, but also it is shorter than those in a distance extending from the disc surface to the information recording face. In reality, the distance from the disc surface to the information recording face in the DVD is 0.6 mm while that in the CD and CD-R is 1.2 mm. Due to this, the wavelength $\lambda$ and the beam size BS of a light beam, and the numerical aperture NA of an objective lens in an optical pickup apparatus for the DVD become different from those in an optical pickup apparatus for the CD or CD-R. For example, the wavelength $\lambda_c$ and the beam size $BS_c$ of a light beam used for the optical pickup apparatus for the CD or CD-R must have 780 nm and 1.4 $\mu$m, respectively, and the numerical aperture $NA_c$ of the objective lens must maintain a range of 0.35 to 0.25. On the other hand, the wavelength $\lambda_D$ and the beam size $BS_D$ of a light beam used for the optical pickup apparatus for the DVD must have, 635 to 650 nm and 0.9 $\mu$m, respectively, and the numerical of aperture $NA_D$ of the objective lens must maintain 0.6.

In order to access all of the CD, CD-R and DVD, the optical pickup apparatus must be able to vary the size of light beam. However, the conventional light source could generate a fixed size of light beam only because it basically takes a structure incapable of varying the size of light beam. This results in the conventional optical pickup apparatus using two light sources as well as having the complex structure.

In reality, as shown in FIG. 1, the conventional light source includes an n-type AlGaAs glut layer 12, a multiple quantum well active layer 14, a p-type AlGaAs glut layer 16 and a P-type GaAs contact layer 18 which are sequentially disposed on an n-type GaAs substrate 10 in such a manner to have a double hetero structure. The conventional light source further includes an n-type GaAs block layer pattern 20, a p-type GaAs buried layer 22 and a conductive layer 24 which are sequentially formed on the upper surface of the p-type GaAs contact layer 18 in such a manner to make a current confined structure. As shown in FIG. 2, the n-type GaAs block layer patterns 20 are positioned at both the left and right sides to provide a guide hole 21 with a tunnel shape in the middle thereof.

In the conventional light source having the structure as described above, if a certain amount of exciting current Im is applied to the conductive layer 24, then holes drift from the p-type GaAs buried layer 22, via the p-type GaAs contact layer 18 and the p-type AlGaAs glut layer 16, into the multiple quantum well active layer 14. Also, electrons drift from the n-type semiconductor substrate 10, via the n-type AlGaAs glut layer 12, into the multiple quantum well active layer 14. A laser light beam is generated in the multiple quantum well active layer 14 by holes entering from the upside thereof and electrons entering from the downside thereof. At this time, the laser light beam is generated in the region positioned at the bottom side of the guide hole 21 in the multiple quantum well active layer 14, and has a constant beam size. This results from holes drifted by the exciting current being uniformly distributed in the guide hole 21 and being not drifted in a plane direction in the guide hole 21.

As described above, the conventional light source is unable to control the size of light beam because it does intrinsically take a structure generating a constant size of light beam. Due to this, the conventional different-type optical disc pickup apparatus had no choice but to use two light sources.

SUMMARY OF THE INVENTION

Accordingly, it is an object of the present invention to provide a variable light source which is capable of controlling the size of light beam.

Another object of the present invention is to provide an optical pickup apparatus for a different-type optical disc which is able to simplify its configuration by utilizing a variable light source.

In order to achieve these and other objects of the invention, a variable light source according to one aspect of the present invention includes a double hetero structure formed to incorporate a multiple quantum well active layer on a semiconductor layer, a current confined structure for progressing carriers drifting toward the multiple quantum well active layer in a combined direction of a perpendicular direction with a progressing direction of a light beam, and an electrode pattern provided on the upper part of the current confined structure for varying a drift speed of carriers drifting in the progressing direction of light beam by a variable current signal.

Further, an optical pickup apparatus for a different-type optical disc according to another aspect of the present invention includes a variable light source for generating a light beam having a different size in accordance with a type of the optical disc, photo detector for converting a light beam reflected by the optical disc into an electrical signal, an objective lens for converging a light beam from the light source to be irradiated onto the optical disc, and light path separating means provided among the light source, the objective lens and the photo detector for transmitting the light beam from the variable light source to the objective lens and the reflected light beam from the objective lens to the photo detector.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
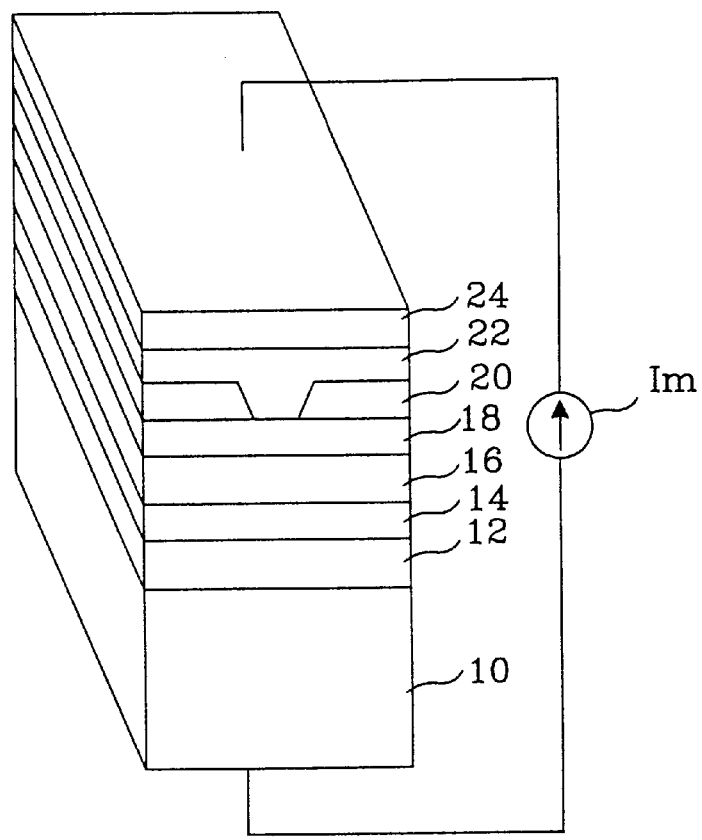
FIG. 1 is a schematic view showing the structure of a conventional light source.
Figure 2:
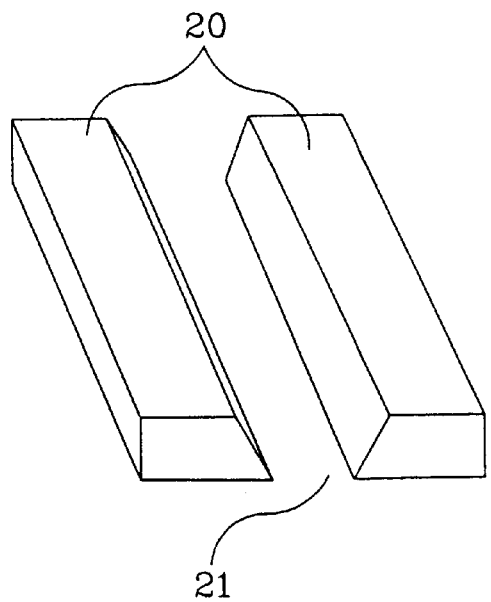
FIG. 2 is a detailed view of the n-type GaAs block layer shown in FIG. 1.
Figure 3:
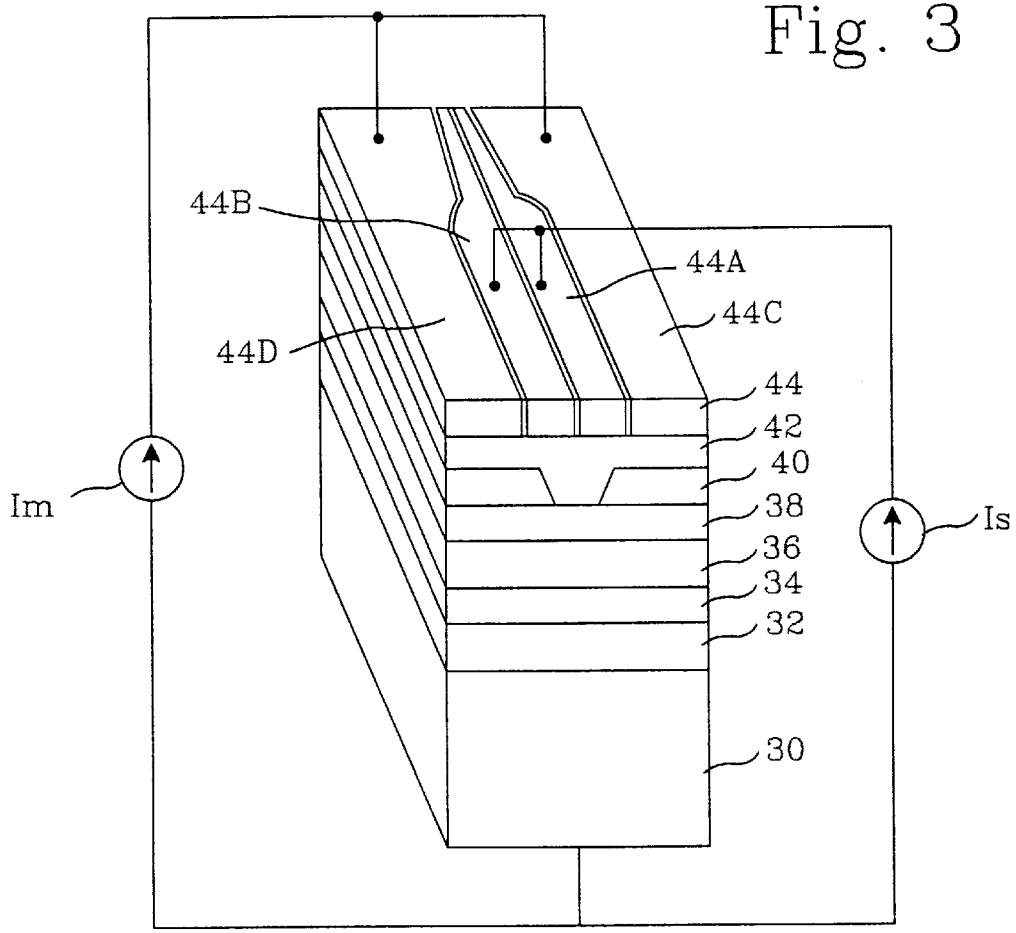
FIG. 3 is a schematic view showing the structure of a variable light source according to an embodiment of the present invention.

Referring to FIG. 3, there is shown a variable light source according to an embodiment of the present invention that includes an n-type AlGaAs glut layer 32, a multiple quantum well active layer 34, a p-type AlGaAs glut layer 36 and a P-type GaAs contact layer 38 which are sequentially disposed on an n-type GaAs substrate 30. These n-type AlGaAs glut layer 32, multiple quantum well active layer 34, p-type AlGaAs glut layer 36 and P-type GaAs contact layer 38 make a double hetero structure on a basis of the multiple quantum well active layer 34. The multiple quantum generates a laser light beam.

Figure 4:
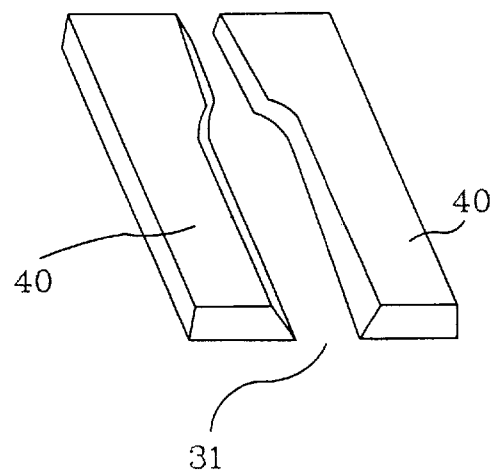
FIG. 4 is a detailed view of the n-type GaAs block layer shown in FIG. 3.

The variable light source further includes an n-type GaAs block layer pattern 40, a p-type GaAs buried layer 42 and a conductive layer 44 which are sequentially formed on the upper surface of the p-type GaAs contact layer 38. The n-type GaAs block layer pattern 40 and the p-type buried GaAs layer 42 make a current confined structure. As shown in FIG. 4, the n-type GaAs block layer patterns 40 are positioned at both the left and right sides of the upper side of the p-type GaAs glut layer 38, respectively, to provide a guide hole 21 with a funnel-section shape in the middle thereof. The n-type GaAs buried layer 42 is buried in the guide hole 31. The guide hole 31 allows holes of major carrier to drift from the upside into the downside as well as from the rear side into the front side. An electrode pattern 44 consists of first and second electrode patterns 44A and 44B symmetrically formed with respect to a center line in such a manner to make a funnel-section shape in the middle portion thereof, and third and fourth electrodes 44C and 44D defined in either outer side of the first and second electrode patterns 44A and 44B, respectively.

Figure 5A:
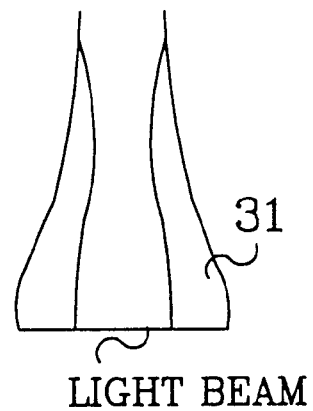
FIG. 5 depicts in the plane form a state of light beam generated at the light source shown in FIG. 3 in accordance with a variable current amount.
Figure 5B:
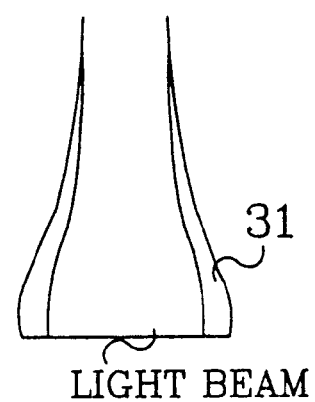
Figure 5C:
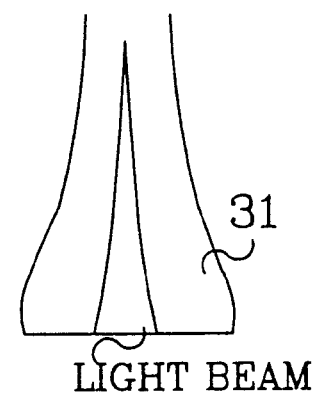

An exciting current signal Im is applied to the third and fourth electrode patterns 44C and 44D, and a variable current signal Is is applied to the first and second electrode patterns 44A and 44B. The exciting current signal Im allows the holes of major carrier on the P-type GaAs buried layer 42 to drift via the guide hole 31 toward the multiple quantum well active layer 34 in such a manner to be converged into the guide hole 31. The variable current signal Is applied to the first and second electrode patterns 44A and 44B controls a drift speed of the holes progressing from the rear side into the front side in the guide hole 31. In other words, the holes progressing from the rear side toward the front side of the guide hole 31 are accelerated according to an increase of variable current signal Is, thereby reducing the size of light beam gradually. Accordingly, the holes drifting from the p-type GaAs buried layer 42, via the guide hole 31, the p-type GaSa contact layer 38 and the p-type AlGaAs glut layer 36 sequentially, into the multiple quantum well active layer 34 make a inclined drift on the section extending from the upside to the downside and from the rear side to the front side. On the other hand, by the exciting current signal Im and/or the variable current signal Is, electrons progress from the n-type GaAs substrate 30, via the n-type AlGaAs glut layer 32, toward the multiple quantum well active layer 34. A laser light beam is generated in the multiple quantum well active layer 34 by the holes from the upside and the electrons from the downside. At this time, the laser light beam is generated at the regions positioned in the bottom portion of the guide hole 31 in the multiple quantum well active layer 34. The intensity and size of the laser light beam change depending upon whether or not the variable current signal Is is applied and an amount of the variable current signal Is. More specifically, when the exciting current signal Im only is applied to the third and fourth electrode patterns 44C and 44D, as shown in FIG. 5(A), the laser light beam is distributed in the interior area of the boundary line distant from the boundary surface of the guide hole 31 to have a medium beam size. Otherwise, when the exciting current signal Im is applied to the third and fourth electrode patterns 44C and 44D and a relatively small amount of variable current signal Is is applied to the first and second electrode patterns 44A and 44B, as shown in FIG. 5(B), the laser light beam is distributed until the area adjacent to the guide hole 31 to have a large beam size. Finally, when the exciting current signal Im is applied to the third and fourth electrode patterns 44C and 44D and a relatively large variable current signal Is is applied to the first and second electrode patterns 44A and 44B, as shown in FIG. 5(C), the laser light beam is distributed only in the center portion of the guide hole 31 to have a very small beam size.

Figure 6:
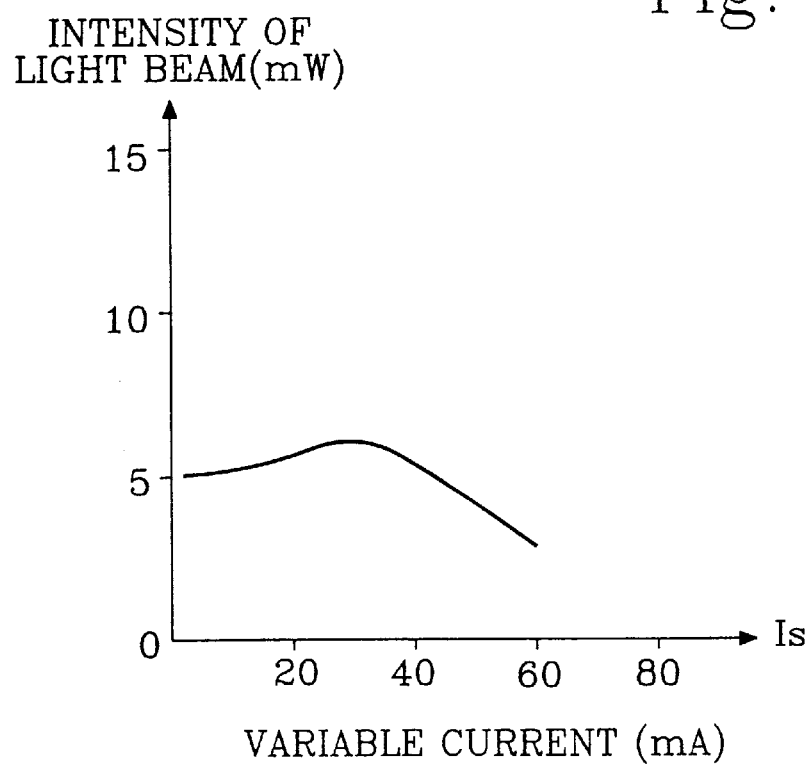
FIG. 6 is a characteristic diagram representing the intensity of light beam generated at the light source shown in FIG. 3 in accordance with a variable current amount.

FIG. 6 represents the intensity of light beam according to an amount of the variable current signal Is. Referring to FIG. 6, the light beam has an intensity of about 5 mW in the region ranged from when the variable current signal Is is not applied until it arrives at a current value of 20 mA; while having a maximum intensity when the variable current signal Is arrives at a current of 20 mA. Also, the intensity of the light beam is reduced gradually as the variable current signal Is increases above 20 mA.

Figure 7:
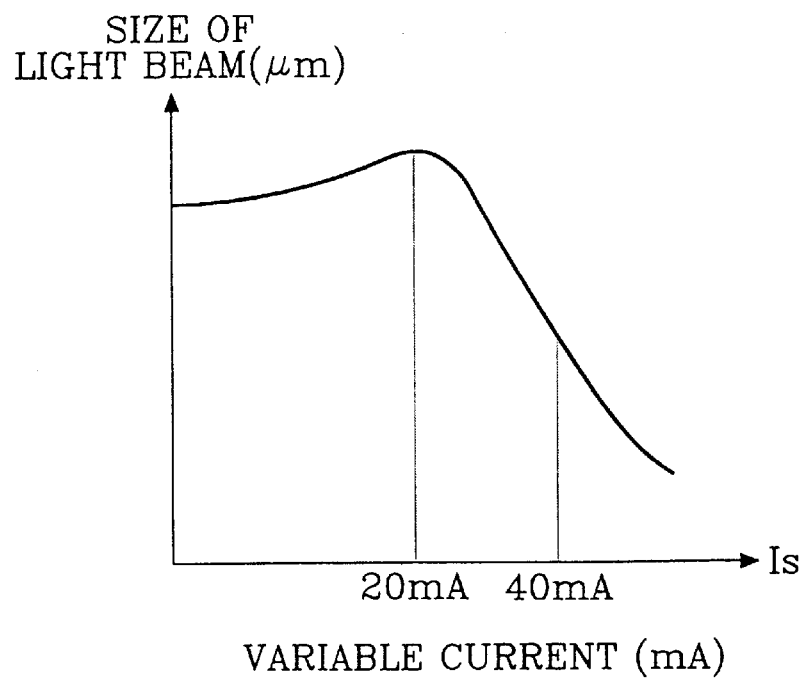
FIG. 7 is a characteristic diagram representing the size of light beam generated at the light source shown in FIG. 3 in accordance with a variable current amount.

FIG. 7 represents the size of light beam according to an amount of the variable current signal Is. As shown in FIG. 7, the light beam has a medium size in the region ranged from when the variable current signal Is is not applied until it arrives at a current value of 20 mA; while having a maximum size when the variable current signal Is arrives at a current of 20 mA. Also, the size of the light beam is reduced gradually as the variable current signal Is increases above 20 mA.

Figure 8:
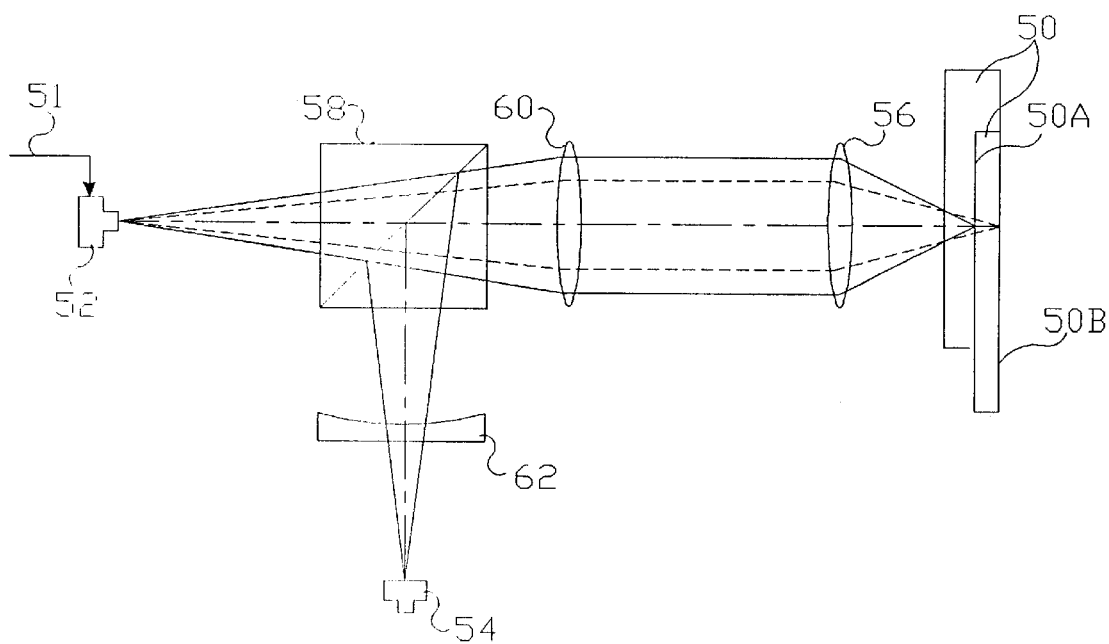
FIG. 8 is a schematic view showing the configuration of an optical pickup apparatus for a different-type optical disc according to an embodiment of the present invention.

Referring now to FIG. 8, there is shown an optical pickup apparatus for a different-type optical disc according to an embodiment of the present invention. The optical pickup apparatus includes a variable light source 52 for generating a light beam to be irradiated onto an optical disc 50, a photo detector 54 for converting the light beam reflected by the optical disc 50 into an electrical signal, and an objective lens for converging the light beam to be irradiated onto the optical disc 50. The variable light source 52 generates a light beam having a different size in accordance with the type of optical disc 50 by the variable current signal Is applied via a control line 51 thereto. More specifically, the variable light source 52 generates a relatively large size of light beam when the optical disc 50 is a CD; while it generates a relatively small size of light beam when the optical disc 50 is a DVD. When the relatively large size of light beam is generated at the variable light source 52, the objective lens 56 allow a spot of the light beam to be formed on the first information recording face 50A of the optical disc 50. On the other hand, when the relatively small size of light beam is generated at the variable light source 52, the objective lens 56 allows a spot of the light beam to be formed on the second information recording face 50B of the optical disc 50. Herein, the first information recording face 50A is an information recording face in the DVD which is positioned in a relatively shallow depth from the surface of the optical disc 50, and the second information recording face 50B is an information recording face in the CD or CD-R which is positioned in a relatively deep depth from the surface of the optical disc 50.

The optical pickup apparatus for a different-type optical disc further includes a beam splitter 58 and a collimator lens 60 installed in parallel between the variable light source 52 and the objective lens 56, and a sensor lens 62 arranged between the beam splitter 58 and the photo detector 54. The beam splitter 58 passes through a light beam from the variable light source 58 in such a manner that the light beam is irradiated, via the collimator lens 60 and the collimator lens 60, onto the first and second information recording faces 50A and 50B of the optical disc 50, and simultaneously reflects a reflected light beam via the objective lens 56 and the collimator lens 60 from the optical disc 50 toward the sensor lens 62. The collimator lens 60 progresses a divergent light beam from the beam splitter 58 toward the objective lens 56 in parallel, thereby preventing a leakage of light beam. On the other hand, the sensor lens 62 converges a light beam progressing from the beam splitter 58 toward the photo detector 54, thereby preventing a leakage of light beam.

As a result, the collimator lens 60 and the sensor lens 62 serve to improve a light sensitivity of the different-type optical disc pickup apparatus above a certain level by preventing a leakage of light beam.

As described above, a variable light source according to the present invention permits a major carrier drifted into the multiple quantum well active layer to be drifted toward the progressing direction of light beam, too, and varying its drift speed, thereby controlling the size of light beam. Accordingly, the variable light source is capable of generating a various size of light beams required by the different-type optical disc pickup apparatus. Further, an optical pickup apparatus for a different-type optical disc according to the present invention provides an advantage in that it is capable of minimizing the number of required optical components as well as simplifying its configuration, by employing the above variable light source.

Although the present invention has been explained by the embodiments shown in the drawing hereinbefore, it should be understood to the ordinary skilled person in the art that the invention is not limited to the embodiments, but rather than that various changes or modifications thereof are possible without departing from the spirit of the invention. Accordingly, the scope of the invention shall be determined only by the appended claims and their equivalents.

What is claimed is:

1. A variable light source, comprising:
   a double hetero structure formed to incorporate a multiple quantum well active layer on a semiconductor layer;
   a current confined structure for progressing carriers drifting toward said multiple quantum well active layer in a combined direction of a perpendicular direction and a progressing direction of a light beam; and
   an electrode pattern provided on the upper part of said current confined structure for varying a drift speed of carriers drifting in said progressing direction of the light beam according to current applied by a plurality of current sources, wherein said electrode pattern includes first and second electrode patterns which are symmetrically formed with respect to the center line thereof to make a funnel-section shape, for receiving an exciting current signal from one of the plurality of the current sources.

2. The variable light source as claimed in claim 1, wherein said current confined structure includes
   a block layer pattern provided to form a guide hole having a funnel-section shape in the middle of the upper part of said double hetero structure; and
   a semiconductor buried layer provided between said block layer pattern and said electrode pattern in such a manner to bury said guide hole.

3. The variable light source as claimed in claim 1, wherein said electrode pattern includes third and fourth electrode patterns which are positioned at the outer periphery of said first and second electrode patterns, respectively, for receiving another exciting current signal for drifting said carriers toward the middle portion thereof in a perpendicular direction.

4. The variable light source as claimed in claim 1, wherein said current confined structure includes
   a block layer pattern provided to form a guide hole having a funnel-section shape in the middle of the upper part of said double hetero structure; and
   a semiconductor buried layer provided between said block layer pattern and said electrode pattern in such a manner to bury said guide hole.

5. A variable laser light source, comprising:
   a plurality of semiconductor layers for generating a laser light beam;
   a guide structure formed within the semiconductor layers and defining a guide hole for guiding the laser light beam to an output end of the laser light source; and
   a plurality of electrodes formed parallel to the guide structure and, in conjunction with the guide structure, varying a size of the laser light beam according to current applied to the plurality of electrodes, wherein the guide hole and at least one of the plurality of electrodes are wider at the output end of the laser light source than at an opposite end of the laser light source.

6. The variable laser light source as in claim 5, wherein the guide hole and said at least one of the plurality of electrodes define a funnel-section shape.

* * * * *